United States Patent [19]
Duft et al.

[11] Patent Number: 5,233,312
[45] Date of Patent: Aug. 3, 1993

[54] DC FEEDBACK CIRCUIT USING SAMPLE AND HOLD CIRCUITS

[75] Inventors: Donald M. Duft, Boulder; Gerald R. Ellis, Blackhawk; Paul Z. Kalotay, Lafayette, all of Colo.

[73] Assignee: Micro Motion, Incorporated, Boulder, Colo.

[21] Appl. No.: 872,529

[22] Filed: Apr. 23, 1992

[51] Int. Cl.[5] .............................................. H03F 1/30
[52] U.S. Cl. ...................................... 330/259; 330/290
[58] Field of Search ............... 330/9, 259, 290, 134, 330/136; 307/491, 359

[56] References Cited

U.S. PATENT DOCUMENTS

| | | | |
|---|---|---|---|
| 3,398,373 | 8/1968 | Caswell | 307/562 X |
| 3,473,131 | 10/1969 | Perkins, Jr. | 307/359 X |
| 4,585,989 | 4/1986 | Matney | 307/359 X |

Primary Examiner—James B. Mullins
Attorney, Agent, or Firm—Duft, Graziano & Forest

[57] ABSTRACT

Sample and hold circuits are used to detect a DC component of an AC signal on an amplifier's output to generate a feedback signal that is applied to the amplifier's input to cancel out a DC component of an AC input signal. The sample and hold circuits detect the peak excursions of the AC output signal and apply the stored peaks to averaging circuitry which determines the magnitude of the DC component of the output signal.

40 Claims, 5 Drawing Sheets

DC FEEDBACK CIRCUIT USING SAMPLE AND HOLD CIRCUITS

FIELD OF THE INVENTION

This invention relates to an amplifier and, in particular, to an amplifier using sample and hold circuits as a DC signal feedback means. The invention more particularly relates to an AC integrating amplifier in which sample and hold circuits are used to provide a DC feedback signal that cancels any undesirable DC signal component applied to the input or appearing at the output of the integrating amplifier.

PROBLEM—BACKGROUND OF THE INVENTION

It is known to use integrating amplifiers (integrators) as low pass filters in applications in which small amplitude symmetrical and repetitive or periodic AC signals must be processed and measured with precision. One such application is in connection with Coriolis effect-type meters such as that shown by Samson and Zolock in U.S. Pat. No. 4,843,890 issued Jul. 4, 1989. In this patent, small amplitude AC signals generated by sensors associated with the Coriolis meter are amplified and applied to integrators which filter the high frequency noise and apply the filtered signals to a logic circuit. The logic circuit measures the time delay ($\Delta t$) between the filtered signals to determine the mass flow rate of the material flowing through the meter. The accuracy of the measurement performed by the logic circuit depends on an accurate measurement of the time delay between the signals applied to the logic circuit. Therefore, the signal processing circuitry intermediate the Coriolis effect meter and the logic circuit must not introduce any random time delays in the signals applied to the logic circuit. For this reason, the processing circuitry is DC coupled to prevent the generation of any undesired time delays. It is also desirable that the input signals be as free from noise as is possible. Samson and Zolock disclose integrators that operate as low pass filters to remove high frequency noise from the signals and to apply to the logic circuitry noise-free signals having the same time delay therebetween as do the two pickoff signals generated by the Coriolis effect meter.

Since the amplifier stages preceding the integrators are DC coupled to the integrators, it is possible that the AC signals applied to the integrators may include a DC component produced by the amplifiers to which the inputs of integrators are DC coupled. Also operational amplifiers used as integrators also generate offset voltages in their operation which have similar detrimental effects. The voltage gain of integrators at low frequencies or at DC is relatively large. Therefore the resulting DC components of input signals can unbalance the integrators and adversely affects their operation. This, in turn, can degrade the operation of the logic circuit that measure the time delay between the integrator output signals.

Attempts have been made to remove this DC component. However, these attempts have been successful only to a limited extent and all have accompanying disadvantages. One such prior art solution is to periodically short the input and output of the integrator. This is undesirable in some applications since it interrupts the operation of the integrator while its input and output are short-circuited. It is further undesirable since the DC component in the output signal reappears immediately upon the short circuit being removed. Another attempted solution is the use of a DC feedback amplifier connected between the output and the input of the integrator. The feedback amplifier receives a filtered portion of the output of the integrator and applies this signal back to the input of the integrator to cancel the DC component. This expedient is not ideal. The input of the feedback amplifier includes a frequency selective network which filters out the AC component of the integrator output signal and applies only a DC signal to the input of the feedback amplifier. This low pass filter is necessary so that the feedback amplifier does not feed back any AC signal from the output to the input of the integrator.

This low pass filter has a low corner frequency of about two to five Hertz (Hz). While this low corner frequency permits the amplifier to function as a DC feedback amplifier, it is disadvantageous in that with this corner frequency of two to five Hz can momentarily unbalance the operation of the integrator when the integrator receives a signal having a frequency component within and below this frequency range. In this case, the integrator operates as a high gain amplifier and generates a large amplitude damped output signal in the two to five Hz range. This damped signal affects disadvantageously the operation of the logic circuit. In addition, the low pass filter increases the response time of the flow metering device, producing slow responses to fast process changes.

The use of the DC feedback amplifier is further disadvantageous since the low pass filters in the right and left channels of a Coriolis meter system may have slightly different frequency responses that can generate very low frequency difference signals when applied to the logic circuit. This can adversely affect the operation of the logic circuit for the duration of time that the disturbance signal persists. For example, if the difference in RC time constants between the right and left channel integrators is 1/10th Hz, this can generate a 0.1 Hz disturbance signal having a persistence of several seconds. During this interval, the logic circuit is incapable of accurately measuring the time difference between the signals generated by the Coriolis effect meter.

It is therefore seen that there currently exists a need for improved circuitry for canceling the DC component that may appear on the input of an AC integrator so that the integrator may operate as a high pass filter for a received AC signal.

SOLUTION—STATEMENT OF THE INVENTION

The above-described problems are solved and an advance in the art is achieved by the operational amplifier of the present invention which includes a DC feedback circuit which overcomes the foregoing problems and disadvantages. The present invention employs a pair of sample and hold circuits to detect the presence of a DC component in the signal on the output of the integrators and, in response thereto, to apply an instantaneous feedback signal to the input of the integrators to cancel the DC component of the input that caused the DC component on the output. A first sample and hold circuit stores the signal amplitude of the positive peaks of the integrator output signal. A second sample and hold circuit stores the signal amplitude of the negative peaks of the integrator output. The output signal of the integrator is sinusoidal and its positive and negative peaks are symmetrical about the X (zero volt) axis whenever the integrator is operating as an AC-only device with no DC signal component on its input. When the integrator receives a DC component on its input, this DC component is amplified by the integrator and the positive and negative peaks of the output signal are then symmetrical about a voltage level that is offset from the zero volt X axis. Offset voltages inherent to the integrators produce similar detrimental offsets.

A voltage divider or a potentiometer is connected between the outputs of the sample and hold circuits so that the midpoint of the voltage divider represents the difference between the maximum positive and negative peaks of the integrator output signal. This midpoint of the potentiometer is at zero volts when there is no DC component in the output signal and is at a DC level other than zero when there is a DC component in the integrator output.

In accordance with the present invention, a portion of this DC signal from the potentiometer is fed back to the input of the integrator to cancel the DC component of the input signal. This permits the integrator to operate with an input signal having only an AC component and produce an output signal without any DC component. The integrator of the invention operates with precision because it receives only an AC input signal, and amplifies and filters this input signal and phase shifts it by 90 degrees. The sample and hold circuits sample the positive and negative peaks of the output signal to generate a DC feedback signal that cancels out any DC component within one AC cycle that might otherwise appear in the integrator input signal. This DC feedback circuitry, including the sample and hold circuits, avoids the disadvantage of the prior art DC feedback circuitry by eliminating the instabilities and other disadvantages associated with the above-described DC feedback mechanisms that have heretofore been used.

The DC feedback circuitry of the present invention is also useful with non-integrating amplifiers to cancel out any DC compoment of an AC signal applied to the input of the amplifier.

BRIEF DESCRIPTION OF THE DRAWINGS

The above advantages and features of the invention may be better understood by a reading of the following detailed description thereof taken in conjunction with the drawings in which.

DETAILED DESCRIPTION

Figure 1:
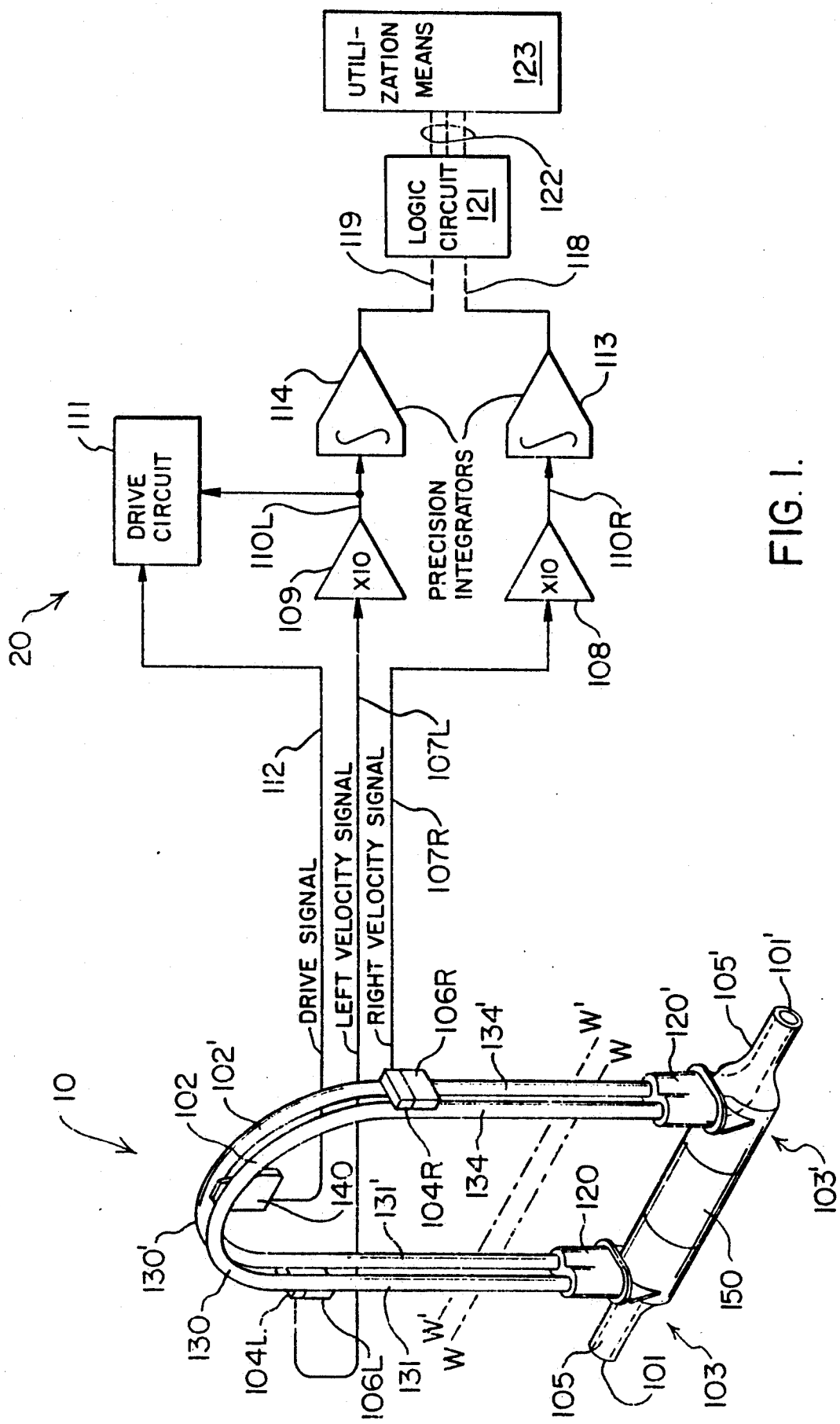
FIG. 1 discloses the invention in block diagram form.

FIG. 1 shows the Coriolis mass flow metering system of the Samson and Zolock patent as employing the integrators of the present invention. The system comprises a Coriolis effect meter 10 and meter electronics 20. Meter 10 generates the output signals 107R and 107L representing the mass flow rate of a fluid flowing through meter 10. Meter electronics 20 processes signals 107R and 107L to derive the mass flow rate and totalized mass flow information.

Coriolis meter 10 includes a pair of manifolds 103 and 103', tubular member 150, and a pair of parallel flow tubes 102 and 102'. Driver 140 is connected to the upper curved portions 130 and 130' of the flow tubes. A pair of velocity sensing coils 104R and 104L together with associated magnets 106R and 106L are affixed to the side legs 131, 131', 134, 134' of the flow tubes. Flow tubes 102 and 102' may be substantially U-shaped as shown and have their lower ends attached to tube mounting blocks 120 and 120' which, in turn, are secured to the respective manifolds 103 and 103'. Meter 10 provides a closed continuous fluid path that permits fluid or material to flow from an input conduit (not shown), to the inlet end 101 of the meter, through input channel 105, through mounting blocks 120, through flow tubes 102 and 102, to right mounting block 120', and through the exit channel 105' and outlet end 101' to an exit conduit (not shown). Tubular member 150 does not conduct any fluid and merely serves to align the manifolds 103 and 103'. Flow tubes 102 and 102' are sinusoidally driven in opposite phase about their bending axes W—W and W'—W' by a signal on path 112 applied to driver 140 by drive circuit 111. Signal 112 sinusoidally vibrates both flow tubes at their resonant frequency.

As fluid flows through the oscillating flow tubes, the resulting Coriolis forces cause differences between the vibratory motion of the two flow tubes. One way to measure these differences is to measure the $\Delta t$ time delay between one point on a flow tube crossing a predetermined plane of reference and another point on the flow tube crossing the same plane. This $\Delta t$ is proportional to the mass of the fluid flowing through the two conduits.

To measure the time interval $\Delta t$, coils 104R and 104L are positioned near the free end of magnets 106R and 106L. The signal outputs generated by coils 104R and 104L provide a velocity profile of the travel of the flow tubes and can be processed to determine the time interval and, in turn, the mass flow rate of the fluid passing through the meter 10. For a more detailed explanation of Coriolis meter operation and measurements, reference is made to the aforementioned Samson and Zolock patent as well as to U.S. Pat. No. Re 31,450, issued to J. E. Smith et al. on Nov. 29, 1983. Reference is further made to U.S. Pat. Nos. 4,187,721; 4,491,025; and 4,843,890; all of which are assigned to the assignee of the present application.

Meter electronics 20 receives the right and left velocity signals 107R and 107L and generates mass flow rate and other information for the fluid passing through meter 10.

Meter electronics 20 includes amplifiers 108 and 109 and integrators 113, 114 which are connected over paths 118, 119 to logic circuit 121. Logic circuit 121 is connected over paths 122 to utilization means 123. Velocity signals 107R and 107L from pickoff coils 104R and 104L are pure AC signals. Amplifiers 108 and 109 amplify these signals and apply them as signals 110R and 110L to integrators 113 and 114. However, output signals 110R and 110L may have a DC component since amplifiers 108, 109, 113 and 114 are direct coupled, rather than AC coupled. This direct coupling is necessary to prevent the introduction of random phase shifts or time delays to signals 110R and 110L. Correct phase relationship is important since the mass flow rate information that is to be derived by the logic circuits is represented by the time delay $\Delta t$ between the signals 107L and 107R. It is therefore necessary that signals 110R and 110L have identical time or phase delays in their paths.

The outputs 118, 119 of integrators 113, 114 are connected to logic circuit 121. The dotted lines associated with a portion of paths 118, 119 represent circuitry shown by Samson and Zolock which is not material to the present invention. Logic circuit 121 determines the mass flow rate for the material flowing in Coriolis meter 10 by measuring the time delay between signals 118 and 119 at predetermined crossing points. This time delay is relatively small and it is therefore important that, if accurate measurements are to be obtained, the signal processing circuitry intermediate signal paths 107R and 107L and logic circuit 121 be free of unknown or random phase shifts or time delays that could swamp the time difference to be measured between the signals generated by coils 104R and 104L. Any unknown delay generated by the processing circuitry could alter the time delays between signals 107R and 107L and thereby make meaningless the relatively small time delay of the signals 110R and 110L applied to logic circuit 121.

Figure 3:
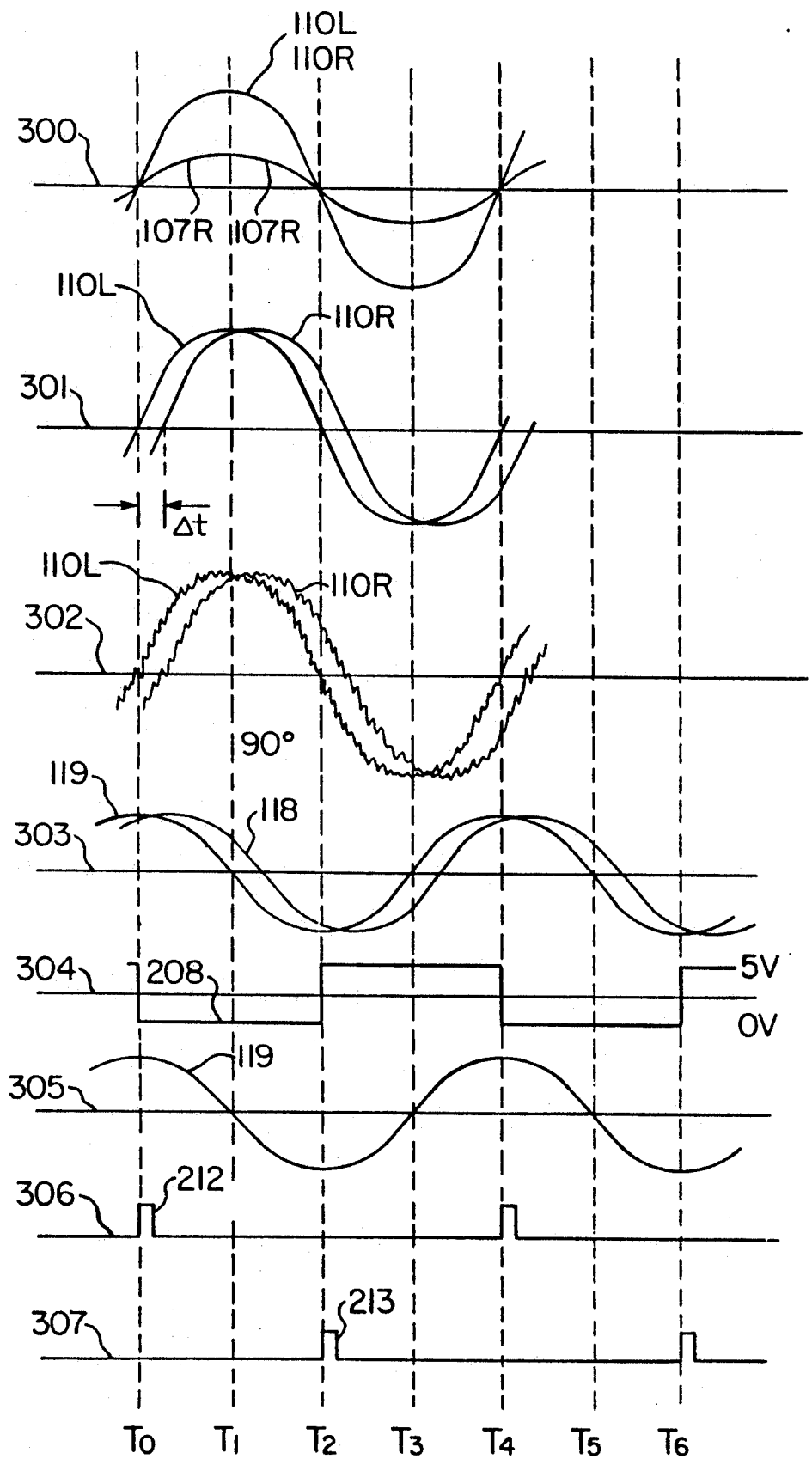
FIG. 3 illustrates waveforms relative to the circuit of FIG. 2.

FIG. 3 shows waveforms associated with various points of the system of FIG. 1. Line 300 of FIG. 3 shows signals 107R and 107L from pickoff coils 104R and 104L as well as signals 110R and 110L which are applied to the inputs of integrators 113 and 114. The conditions portrayed in line 300 assume that signals 107R, 107L, 110R, and 110L are free from time delay and noise. Signals 110R and 110L, as well as signals 107R and 107L, are superimposed on one another to represent a zero time delay therebetween when no material is flowing through meter 10.

Line 301 of FIG. 3 shows waveforms 110R and 110L under conditions in which fluid is flowing through the meter 10. The two waveforms are displaced from one another by an amount represented as $\Delta t$ along the X axis. This $\Delta t$ represents a time delay resulting from the concurrent vibrating movement of the flow tubes driven by driver 140 and the Coriolis forces generated as the fluid flows through tubes 102 and 102'. This $\Delta t$ differential represents the displacement between pickoff signals 107R and 107L as well as between signals 110R and 110L. Signals 110R and 110L portray idealized conditions in which the outputs of amplifiers 108 and 109 are free from noise, and free from any time delay within amplifiers 108 and 109. Output signals 118 and 119 of integrators 113, 114 are shown on line 303 and are phase shifted from signals 110R and 110L by 90 degrees by integrators 113 and 114. Output signal 119 for the left channel integrator 114 is shown on line 305 where it is shown displaced 90 degrees from input signal 110L shown on line 301.

Line 302 of FIG. 3 shows waveforms 110R and 110L under conditions in which there is noise in the pickoff signals 107R and 107L. This noise appears in amplified form in signals 110R and 110L and is undesirable since the noise around the time delay detection levels makes it difficult to precisely measure the time delay between the two signals if they were to be directly applied to logic circuit 121. It is relatively easy for logic circuit 121 to measure the $\Delta t$ phase shift between the two signals for a noise free condition as shown in line 301. It is difficult for logic circuit 121 to make a meaningful $\Delta t$ measurement for noisy signals of the type shown on line 302 since the presence of the noise creates false timing relationships in the vicinity of the measurement levels.

Integrators 113 and 114 are used as low pass filters to reduce this noise so that the output signals 118 and 119 are relatively noise-free as shown for line 303.

In partial summary of the above, the right and left pickoff signals 107R and 107L are amplified by amplifiers 108 and 109 and applied as amplified signals 110R and 110L to the integrators. These input signals may contain noise as shown on line 302 of FIG. 3. The integrators operate as a low pass filter and remove this noise so that the integrator output signals 118 and 119 on line 303 are free from noise and have a time differential $\Delta t$ therebetween which faithfully corresponds to the time differential between pickoff signals 107R and 107L as well as between signals 110R and 110L. Signals 118 and 119 are applied to logic circuit 121 which measures the time difference between the two signals and computes the mass flow rate of the fluid flowing through meter 10.

Figure 2:
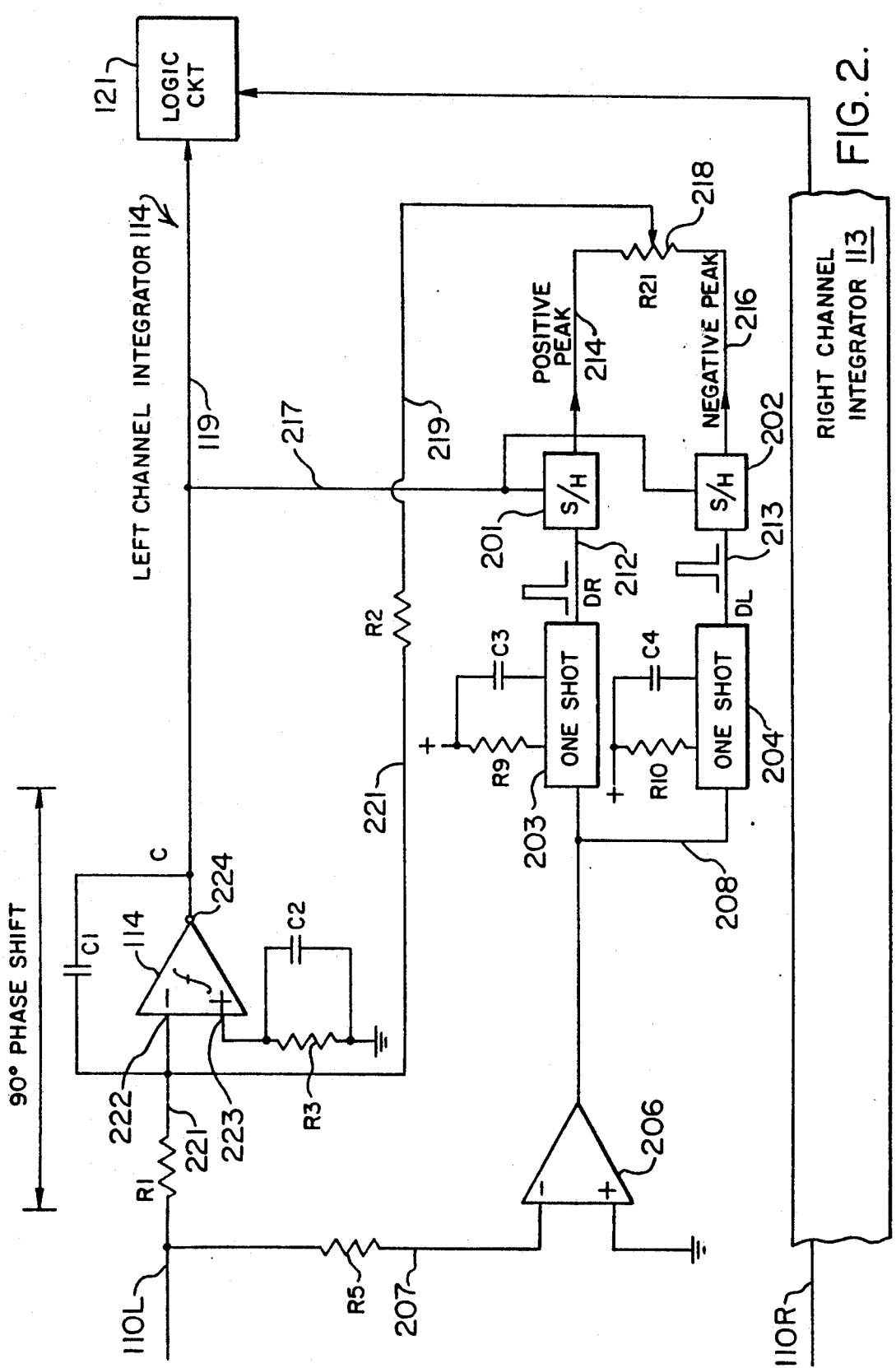
FIG. 2 discloses the circuit of the integrator of FIG. 1.

FIG. 2 discloses further details of integrators 113 and 114 of FIG. 1 embodying the current invention. The left channel integrator 114 is shown in detail while the right channel integrator 113 is shown only diagrammatically since it is identical to the left channel integrator 114. The operation of the left channel integrator circuit 114 is now described with reference to FIG. 2 and the waveforms of FIG. 3.

On FIG. 2, the amplified left channel pickoff signal 110L is extended through resistor R1 and over path 221 to the inverting input 222 of operational amplifier 114. Operational amplifier 114, resistor R1 and capacitor C1 together comprise an integrator. The non-inverting input 223 of the operational amplifier is connected to ground by the parallel combination of resistor R3 and capacitor C2, which have the same values as R1 and C1. The purpose of these elements is to present the same impedance to the non-inverting input 223 as is seen by the inverting input 222. Integrator 113 operates as a low pass filter. The amplification of the integrator is greatest at DC and low frequencies and decreases as frequency increases due to the negative feedback signal provided by capacitor C1.

Any DC component that might be applied by amplifier 109 (FIG. 1) to input signal 110L or generated anywhere in the integrator circuit is effectively canceled by the feedback circuitry about to be described so that integrator 114 operates with no DC offset on its output. This being the case, the output of integrator 114 on path 119, as shown on lines 303 and 305 of FIG. 3, is a relatively noise-free signal that is shifted by precisely 90 degrees with respect to input signal 110L (FIG. 3, line 300) applied to the integrator input 222. Right channel integrator 113 operates in a similar manner in response to the reception of input signal 110R and generates output signal 118 which is applied to the input of logic circuit 121 along with signal 119 from the left channel integrator 114.

Both signals 118 and 121 (FIG. 3, line 303) are shifted 90 degrees with respect to their input signals 110R and 110L on line 300. However, this phase shift is a known and constant value and does not affect the relative time delay $\Delta t$ between the output signals 118 and 119. Thus, the two output signals of the integrators are shifted from each other by an amount $\Delta t$ that is identical to the $\Delta t$ shift between the pickoff signals 107R and 107L generated by the pickoff coils 104R and 104L on FIG. 1.

Input signal 110L on FIG. 2 is also applied through resistor R5 and over path 207 to the inverting input of voltage comparator 206 whose non-inverting input is grounded. The output of comparator 206 is connected to the positive and negative trigger inputs of monostable multivibrators (one-shots) 203 and 204. The comparator 206 receives the symmetrical sinusoidal input waveform on path 207 and generates a square wave output on path 208. The square wave output signal has steep leading and trailing edges due to the high voltage gain and clamping action of comparator 206. The square wave output signal 208 is shown on line 304 of FIG. 3 and varies between zero volts and five volts positive.

One shot circuit 203 responds to trailing edge transitions of square wave 208 and generates a short positive going signal 212 in response to each negative (trailing edge) transition of square wave 208. Output signal 212 of one shot 203 is shown on line 306 of FIG. 3. One shot 204 responds to the leading edges of square wave 208 and generates a short output signal 213 at time T2 shown on line 307 of FIG. 3. Output signals 212 and 213 are phase shifted from each other by 180 degrees.

Components R9, R10, C3 and C4 connected to one-shots 203 and 204 and to a positive supply voltage together determine the length of pulses shown on line 306 and 307.

Pulse signal 212 causes sample and hold circuit 201 to receive and store the value of the integrator output signal 119 at the time (T0 and T4) input pulse 212 is applied. It can be seen on line 306 of FIG. 3 that the pulses 212 are applied to sample and hold circuit 201 at the time that the output signal 119 of the integrator is at or near its positive peak value. Pulse 213 from one shot 204 is phase shifted from pulse 212 by 180 degrees and causes sample and hold circuit 202 to receive and store the value of integrator output signal 119 at time T2 and T6. On line 307 of FIG. 3 it can be seen that pulse 213 is generated at the time that output signal 119 is at or near its negative peak value. This being the case, sample and hold circuit 202 stores the negative peak value of the output signal on path 119 while sample and hold circuit 201 stores the positive peak value of signal 119.

The output 214 of sample and hold circuit 201 is applied to the top terminal of voltage divider R21 and the output 216 of sample and hold circuit 202 is applied to the lower input of voltage divider R21. Center tap 218 of voltage divider R21 represents the difference of the positive and negative peaks of the waveform 119. For conditions under which integrator 114 does not receive a DC component of on its input, the amplitude of the positive peak of signal 119 equals the amplitude of the negative peak so that a zero volt signal is applied to center tap of voltage divider R21. For conditions in which the input signal received by integrator 114 has a DC component, the positive and negative peaks of output signal 119 are not equal with respect to the 0 volt X axis and are shifted either in a positive or a negative direction. In this case, tap 218 of the voltage divider R21 assumes a DC value equal to the amount by which the integrator output signal 119 is shifted with respect to the 0 volt X axis. This DC potential on path 219 is proportional to the offset appearing at the output of the integrator. This DC signal 219 is extended through resistor R2 to cancel out the DC component of the loop, including the integrator. This shifts the operation of the integrator so that the peak excursions of its output signal 119 are symmetrical about this 0 volt X axis. The right channel integrator operates in a similar manner with any DC component appearing on its input being immediately detected and canceled out by its sample and hold circuits.

Figure 4:
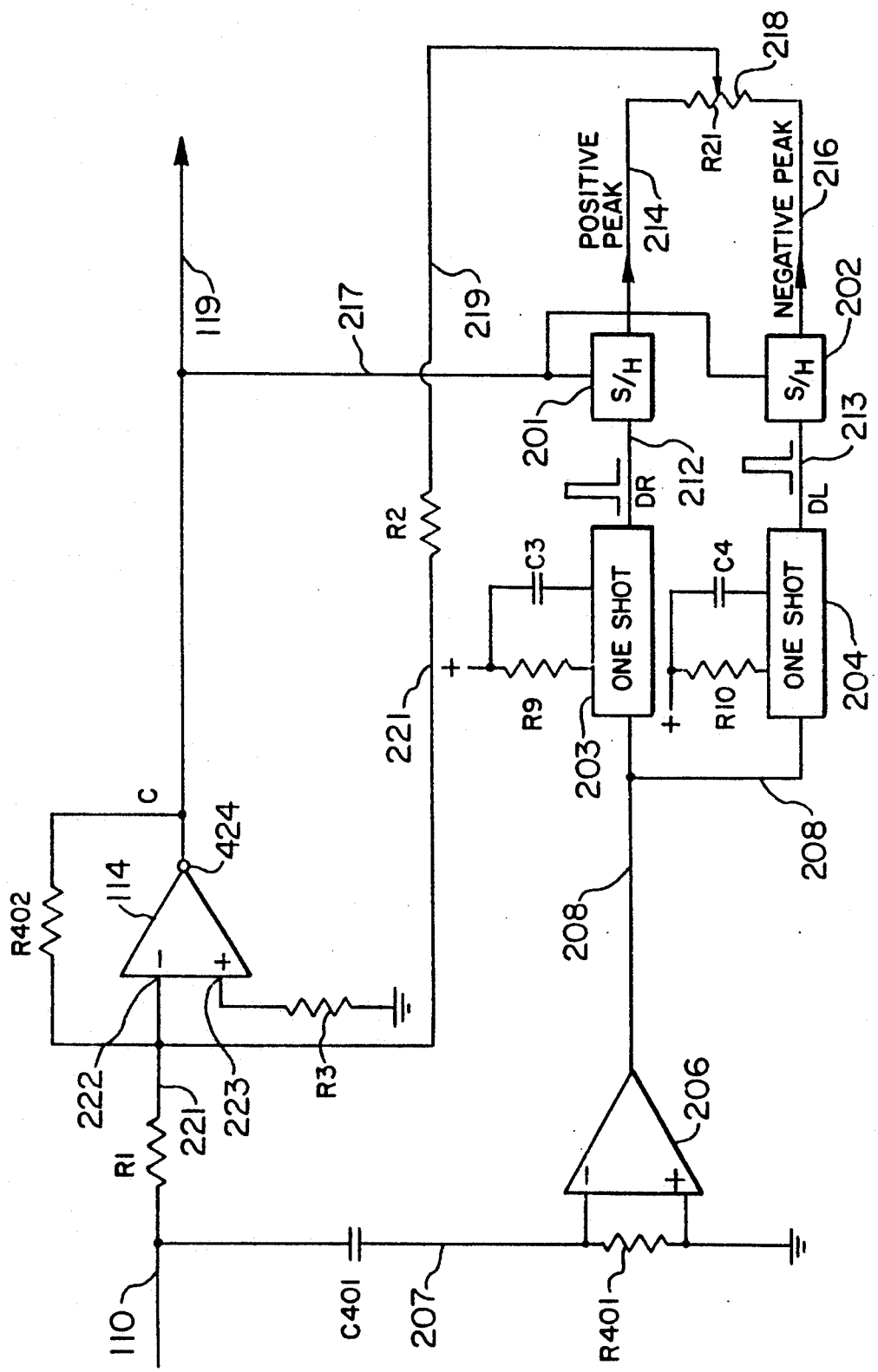
FIG. 4 discloses the circuit of a non-integrating amplifier.

FIG. 4 illustrates how a pair of sample and hold circuits can be used to detect a DC offset in an output signal of a non-integrating amplifier and to apply this detected DC offset voltage back to the input of the amplifier cancel the DC offset. The circuit of FIG. 4 is similar to the left channel integrator 114 of FIG. 2. Elements on FIG. 4 that correspond to elements on FIG. 2 are designated with the same reference numerals. Elements that are new to FIG. 4 are designated with a reference number in the 400 series. On FIG. 4, element 424 is a conventional operational amplifier rather than an integrating amplifier as is the case for integrator 224 of FIG. 2. Therefore, the feedback means for amplifier 424 comprises resistor 402 rather than the feedback capacitor C1 for integrating amplifier 224. Also, in FIG. 4, the connection between the input conductor 110 and the inverting input of the comparator 206 comprises a differentiator. Specifically, capacitor C401 interconnects input conductor 110 with the inverting input of comparator 205 and resistor R401 interconnects the inverting input of comparator 205 to ground. The series connection of capacitor C401 and resistor 401 is a differentiator (90 degrees phase shift) so that the signal received by the inverting input of comparator 206 comprises the differentiated signal 110. The remainder of the circuit elements shown on FIG. 4 are identical to those shown on FIG. 2 and, therefore, a detailed description of their operation is not repeated.

Figure 5:
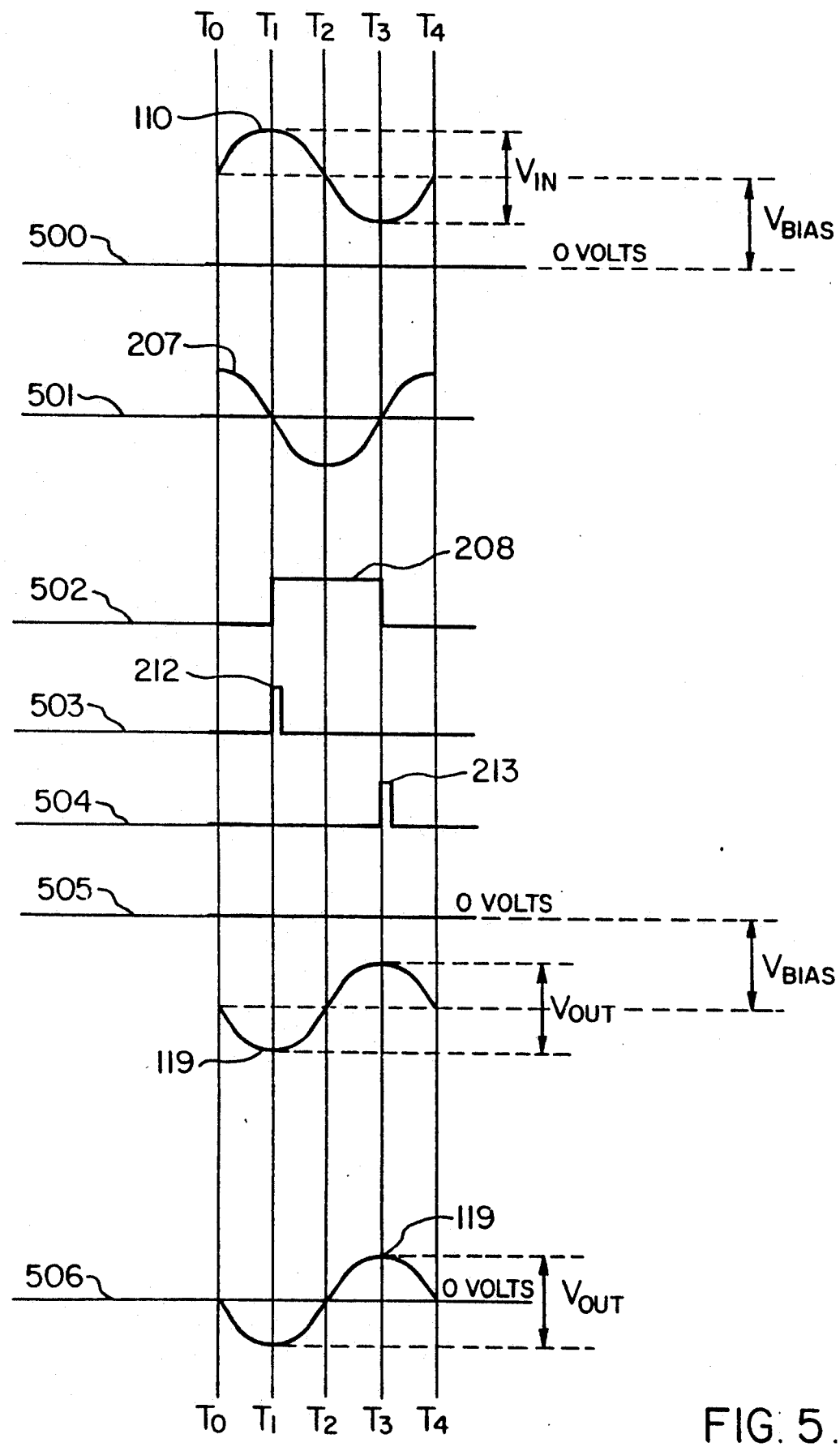
FIG. 5 illustrates waveforms relative to the circuit of FIG. 4.

The operation of the circuitry of FIG. 4 is now described with regard to the timing diagram of FIG. 5.

Line 500 of FIG. 5 displays the input signal 110 received on input conductor 110 of FIG. 4. This input signal is a sine wave having an amplitude of $V_{in}$ that is offset from a 0 volt X axis by an amount designated as $V_{bias}$. Input signal 110 is differentiated by capacitor C401 and resistor R401 with the resultant differentiated signal 207 being applied to the inverting input of amplifier 206. This signal 207 is shown on line 501 of FIG. 5. Signal 501 is phase shifted 90 degrees with respect to input signal 110 shown on line 500.

Comparator 206 operates as described for FIG. 2 to generate the square wave signal 208 shown on line 502. This square wave signal 208 is applied to the two one-shot circuits 203 and 204 which operate as described for FIG. 2. One shot 203 generates a pulse output 212 shown on line 503 in response to each leading edge of square wave signal 208. One shot 204 responds to each trailing edge of signal 208 and generates the positive pulse 213 shown on line 504. The positive pulses 212 and 213 are applied to the sample and hold circuits 201 and 202, respectively. These sample and hold circuits store the signal peaks appearing on the output 119 of amplifier 424. The output of amplifier 424 without DC feedback is shown in line 505 as a sine wave 119 having an amplitude $V_{out}$ and a DC offset of $V_{bias}$.

One shot 203 and sample and hold circuit 201 operate at time T1 to sample the amplitude of output signal 119. As can be seen on line 505, the output signal $V_{out}$ is at its maximum negative peak at time T1. One-shot 204 and sample and hold circuit 202 operate at time T3 and sample the amplitude of the positive peak of output signal 119. The amplitudes of the positive and negative peaks are applied to voltage divider R21 and the center tap 218 of voltage divider R21 has a DC potential equal to $V_{bias}$. This DC signal is applied over path 219, through resistor R2 and over path 221 to the input of amplifier 424. With the circuit components set at the proper value to produce the correct feedback loop gain, this signal cancels the DC offset appearing on the output of amplifier 424. This removal of the DC offset from the output of amplifier 424 produces a pure AC signal 119 within one cycle of the input signal that is symmetrical about the 0 volt axis as shown on line 506, without any undesirable phase shift or time delay. This is shown on line 516 of FIG. 5.

In summary, the principles of the present invention comprising the use of sample and hold circuits, may be utilized to provide a DC feedback signal that cancels out the DC component of an input signal that caused a DC component in the output signal. The use of sample and hold circuits to perform this function is equally applicable to conventional type DC coupled operational amplifiers as well as to integrating type DC amplifiers.

The above disclosure sets forth one possible embodiment of the present invention. Other arrangements or embodiments not precisely set forth could be practiced under the teachings of the present invention and as set forth in the following claims.

We claim:

1. An operational amplifier having an input and an output and circuitry for preventing a DC level shifting and saturation of said operational amplifier in response to the concurrent reception by said input of an AC signal and a DC offset, said operational amplifier circuitry comprising:
    circuitry connected to said output and controlled by circuitry responsive to said reception of said AC signal and independent of said operational amplifier for storing the amplitude of positive and negative signal peaks appearing on said output in response to the reception of an AC signal on said input,
    means for generating a feedback signal representing the averaged amplitude of said positive and negative signal peaks, and
    means for applying at least a portion of said feedback signal to said input that receives said AC signal to cancel any DC offset of said AC signal on said input.

2. The operational amplifier of claim 1 wherein said operational amplifier is an integrating operational amplifier whose output signal is phase shifted by 90° with respect to said AC signal.

3. The integrating operational amplifier of claim 2 wherein said circuitry for storing comprises:
    a first sample and hold circuit connected to said output,
    means responsive to transitions of a first polarity of said AC signal for operating said first sample and hold circuit at the zero crossing of said AC input signal to store the peak amplitude of signals of one polarity appearing on said output,
    a second sample and hold circuit connected to said output, and
    means responsive to transitions of a second polarity of said AC signal for operating said second sample and hold circuit at the zero crossing of said AC signal to store the peak amplitude of signals of another polarity appearing on said output.

4. The integrating operational amplifier of claim 3 wherein said means for generating comprises:
    a voltage divider connected between an output of said first sample and hold circuit and an output of said second sample and hold circuit,
    a tap on said voltage divider,
    said first and second sample and hold circuits being effective to apply potentials to said voltage divider so that the potential of said tap represents the average value of said signals stored in said first and second sample and hold circuits, and
    wherein said means for applying comprises:
    means for extending at least a portion of said potential on said tap to said input of said integrating operational amplifier to cancel any DC component of an AC signal applied to said input of said integrating operational amplifier.

5. The integrating operational amplifier of claim 3 wherein said means responsive to said transitions comprises:
    square wave generating means connected to said input of said integrating operational amplifier,
    said square wave generating means being responsive to the receipt of an AC signal on said input of said integrating operational amplifier for generating a square wave signal having the same frequency as said AC signal,
    means responsive to the generation of each leading edge of said square wave signal to operate said first sample and hold means to store the peak amplitude of said signal of one polarity on said output of said integrating operational amplifier, and
    means responsive to the generation of each trailing edge of said square wave signal to operate said second sample and hold circuit to store the peak amplitude of said signal of another polarity on said output of said integrating operational amplifier.

6. The operational amplifier of claim 1 wherein said circuitry for storing comprises:
    a first sample and hold circuit connected to said output,
    means responsive to transitions of a first polarity of said AC signal for operating said first sample and hold circuit to store the peak amplitude of signals of one polarity appearing on said output,
    a second sample and hold circuit connected to said output, and
    means responsive to transitions of a second polarity of said AC signal for operating said second sample and hold circuit to store the peak amplitude of signals of another polarity appearing on said output.

7. The operational amplifier of claim 6 wherein said means for applying comprises:
    a voltage divider connected between an output of said first sample and hold circuit and an output of said second sample and hold circuit,
    a tap on said voltage divider,
    said first and second sample and hold circuits being effective to apply potentials to said voltage divider so that the potential of said tap represents the average value of said signals stored in said first and second sample and hold circuits, and
    means for extending at least a portion of said potential on said tap to said input of said integrating operational amplifier to cancel any DC component of an AC signal applied to said input of said integrating operational amplifier.

8. The operational amplifier of claim 7 in combination with:

means for differentiating said AC signal for generating a differentiated AC signal, square wave generating means connected to said means for differentiating, said square wave generating means being responsive to the generation of said differentiated AC signal for generating a square wave signal having the same frequency as said differentiated AC signal, means responsive to the generation of each leading edge of said square wave signal to operate said first sample and hold means to store the peak amplitude of said signal of one polarity on said output of said integrating operational amplifier, and means responsive to the generation of each trailing edge of said square wave signal to operate said second sample and hold circuit to store the peak amplitude of said signal of another polarity on said output of said operational amplifier.

9. An operational amplifier having an input and an output and circuitry for preventing a DC level shifting and saturation of said operational amplifier in response to the reception by said input of an AC signal having a DC offset, said operational amplifier circuitry comprising:

a first storage circuit connected to said output and controlled by circuitry independent of said operational amplifier and operable in response to the receipt of said AC signal for storing the peak amplitude of positive signals appearing on said output in response to the reception of signals of a first polarity on said input, a second storage circuit connected to said output and controlled by circuitry independent of said operational amplifier and operable in response to the receipt of said AC signal for storing the peak amplitude of negative signals appearing on said output in response to the reception of signals of a second polarity on said input, means for generating a feedback signal representing the averaged peak amplitude of said signals stored by said first and second storage circuits, and means for applying at least a portion of sad feedback signal to said input that receives said AC signal to cancel any DC offset of an AC signal applied to said input.

10. The operational amplifier of claim 9 wherein said first and second storage circuits comprise a first and a second sample and hold circuits;

said operational amplifier further comprising:

means for differentiating said AC signal for enabling the precision sampling of the peak amplitude of said AC signal containing said DC offset, means responsive to transitions of a first polarity of said input signal for operating said first sample and hold circuit at the zero crossing of said differentiated signal to store the peak amplitude of positive signals appearing on said output, and means responsive to transitions of a second polarity of said input signal for operating said second sample and hold circuit at the zero crossing of said differentiated signal to store the peak amplitude of negative signals appearing on said output.

11. The operational amplifier of claim 10 wherein said means for generating a feedback signal comprises:

a voltage divider connected between an output of said first sample and hold circuit and an output of said second sample and hold circuit, a tap on said voltage divider, and said first and second sample and hold circuits being effective to apply potentials to said voltage divider so that the potential of said tap represents the averaged value of said positive and negative peak signals stored in said first and second sample and hold circuits.

12. The operational amplifier of claim 11 wherein said means for applying comprises:

means for applying at least a portion of said potential on said tap to said input of said operational amplifier to cancel any DC component of an AC signal applied to said input of said operational amplifier.

13. The operational amplifier of claim 9 wherein said amplifier is an integrating operational amplifier.

14. The operational amplifier of claim 13 wherein said first and second storage circuits comprise a first and second sample and hold circuits;

said operational amplifier further comprising:

means responsive to transitions of a first polarity of said input signal for operating said first sample and hold circuit at the zero crossing of said AC input signal to store the peak amplitude of positive signals appearing on said output, and means responsive to transitions of a second polarity of said input signal for operating said second sample and hold circuit at the zero crossing of said AC signal to store the peak amplitude of negative signals appearing on said output.

15. The operational amplifier of claim 14 wherein said means for generating a feedback signal comprises:

a voltage divider connected between an output of said first sample and hold circuit and an output of said second sample and hold circuit, a tap on said voltage divider, and said first and second sample and hold circuits being effective to apply potentials to said voltage divider so that the potential of said tap represents the averaged value of said signals stored in said first and second sample and hold circuits.

16. The operational amplifier of claim 15 wherein said means for applying comprises:

means for applying at least a portion of said potential on said tap on said input of said integrating operational amplifier to cancel any DC component of an AC signal applied to said input of said integrating operational amplifier.

17. An operational amplifier having an input and an output and circuitry for preventing a DC level shifting and saturation of said operational amplifier in response to the reception by said input of an AC signal having a DC offset, said operational amplifier circuitry comprising:

a first sample and hold circuit connected to said output, means independent of said operational amplifier and responsive to transitions of a first polarity of said AC signal for operating said first sample and hold circuit to store the peak amplitude of signals of a positive polarity appearing on said output, a second sample and hold circuit connected to said output, means independent of said operational amplifier and responsive to transitions of a second polarity of said AC signal for operating said second sample and hold circuit to store the peak amplitude of signals of a negative polarity appearing on said output, a voltage divider connected between an output of said first sample and hold circuit and an output of said second sample and hold circuit, a tap on said voltage divider, said first and second sample and hold circuits being effective to apply a potential across said voltage divider so that the potential of said tap represents the averaged value of said signals stored in said first and second sample and hold circuits, and means for applying at least a portion of said potential on said tap to said input of said operational amplifier that receives said AC signal to cancel any DC component of said AC signal applied to said input of said operational amplifier.

18. The operational amplifier of claim 17 wherein said means for operating said first sample and hold circuit and said second sample and hold circuit comprises:

a differentiator connected to said input, said differentiator being responsive to the receipt of an AC signal on said input for generating a differentiated AC signal, square wave generating means responsive to said generation of said differentiated AC signal for generating a square wave signal having the same frequency as said differentiated AC signal, means responsive to the generation of each leading edge of said square wave signal to operate said first sample and hold means to store the peak amplitude of a signal of a first one of said positive and negative polarities appearing on said output of said integrating operational amplifier, and means responsive to the generation of each trailing edge of said square wave signal to operate said second sample and hold circuit to store the peak amplitude of a signal of a second one of said positive and negative polarities appearing on said output of said integrating operational amplifier.

19. The operational amplifier of claim 17 wherein said operational amplifier is an integrating operational amplifier.

20. The operational amplifier of claim 17 wherein said means for operating said first sample and hold circuit and said second sample and hold circuit comprises:

square wave generating means responsive to the receipt of said AC signal for generating a square wave signal having the same frequency as said AC input signal, means responsive to the generation of each leading edge of said square wave signal to operate said first sample and hold means to store the peak amplitude of a signal of a first one of said positive and negative polarities appearing on sad output of said integrating operational amplifier, and means responsive to the generation of each trailing edge of said square wave signal to operate said second sample and hold circuit to store the peak amplitude of a signal of a second one of said positive and negative polarities appearing on said output of said integrating operational amplifier.

21. A method of operating an operational amplifier having an input and an output and circuitry for preventing a DC level shifting and saturation of said operational amplifier in response to the concurrent reception by said input of an AC signal and a DC offset, said method comprising the steps of:

operating circuitry independent of said operational amplifier and responsive to the receipt of said AC signal for storing the peak of positive and negative signals appearing on said output in response to the reception of an AC signal on said input, generating a feedback signal representing the averaged peak amplitude of said positive and negative signals, and applying at least a portion of said feedback signal to said input that receives said AC signal to cancel any DC component of said AC signal on said input.

22. The method of claim 21 which includes the step of operating said operational amplifier as an integrating operational amplifier whose output signal is phase shifted by 90° with respect to said AC signal.

23. The method of claim 22 wherein said step of storing comprises the steps of:

operating a first sample and hold circuit at the zero crossing of said AC signal to store the peak amplitude of signals of one polarity appearing on said output in response to transitions of a first polarity of said AC signal, and operating a second sample and hold circuit at the zero crossing of said AC signal to store the peak amplitude of signals of another polarity appearing on said output in response to transitions of a second polarity of said AC signal.

24. The method of claim 23 wherein said step of generating a feedback signal comprises the step of:

operating said first and second sample and hold circuits for applying potentials to a voltage divider connected between an output of said first sample and hold circuit and an output of said second sample and hold circuit so that the potential of a tap on said voltage divider represents the average value of said signals stored in said first and second sample and hold circuits, and wherein said step of applying comprises the step of:

extending at least a portion of said potential on said tap to said input of said integrating operational amplifier to cancel any DC component of an AC signal applied to said input of said operational amplifier.

25. The method of claim 24 in combination with the steps of:

operating a square wave generating means connected to said input in response to the receipt of an AC signal on said input for generating a square wave signal having the same frequency as said AC signal on said input, operating said first sample and hold circuits to store the peak amplitude of said signal of one polarity on said output of said operational amplifier in response to the generation of each leading edge of said square wave signal, and operating said second sample and hold circuit to store the peak amplitude of said signal of another polarity on said output of said integrating operational amplifier in response to the generation of each trailing edge of said square wave signal.

26. The method of claim 21 wherein said step of storing comprises the steps of:

operating a first sample and hold circuit to store the peak amplitude of signals of one polarity appearing on said output in response to transitions of a first polarity of said AC signal, and operating a second sample and hold circuit to store the peak amplitude of signals of another polarity appearing on said output in response to transitions of a second polarity of said AC signal.

27. The method of claim 26 wherein said step of generating a feedback signal comprises the step of:

operating said first and second sample and hold circuits for applying potentials to a voltage divider connected between an output of said first sample and hold circuit and an output of said second sample and hold circuit so that the potential of a tap on said voltage divider represents the average value of said signals stored in said first and second sample and hold circuits, and wherein said step of applying comprises the step of:

extending at least a portion of said potential on said tap to said input of said operational amplifier to cancel any DC component of an AC signal applied to said input of said operational amplifier.

28. The operational amplifier of claim 27 in combination with the steps of:

differentiating said AC signal on said input for generating a differentiated AC signal, operating square wave generating means in response to the generation of said differentiated AC signal for generating a square wave signal having the same frequency as said differentiated AC signal, operating said first sample and hold means to store the peak amplitude of said signal of one polarity on said output of said operational amplifier in response to the generation of each leading edge of said square wave signal, and operating said second sample and hold circuit to store the peak amplitude of said signal of another polarity on said output of said operational amplifier in response to the generation of each trailing edge of said square wave signal.

29. A method of operating an operational amplifier having an input and an output and circuitry for preventing a DC level shifting and saturation of said operational amplifier in response to the reception by said input of an AC signal having a DC offset, said method comprising the steps of:

receiving an AC signal having a DC component on an input of said operational amplifier, operating a first storage circuit connected to an output of said operational amplifier under control of a circuit independent of said operational amplifier and responsive to the reception of said AC signal for storing the peak amplitude of positive signals appearing on said output in response to the reception of signals of a first polarity on said input, operating a second storage circuit connected to said output under control of a circuit independent of said operational amplifier and responsive to the reception of said AC signal for storing the peak amplitude of negative signals appearing on said output in response to the reception of signals of a second polarity on said input, generating a feedback signal representing the averaged amplitude of said signals stored by said first and second storage circuits, and applying at least a portion of said feedback signal to said input that receives said AC signal to cancel any DC component of an AC signal applied to said input.

30. The method of claim 29 wherein said first and second storage circuits comprise a first and a second sample and hold circuits;

said method further comprising the steps of:

differentiating said AC signal to provide for the precision sampling of the peak amplitude of said AC signal containing said DC offset, operating said first sample and hold circuit at the zero crossing of said differentiated signal to store the peak amplitude of positive signals appearing on said output in response to transitions of a first polarity of said input signal, and operating said second sample and hold circuit at the zero crossing of said differentiated signal to store the peak amplitude of negative signals appearing on said output in response to transitions of a second polarity of said input signal.

31. The method of claim 30 wherein said step of generating a feedback signal comprises the steps of:

connecting a voltage divider between an output of said first sample and hold circuit and an output of said second sample and hold circuit, said first and second sample and hold circuits being effective to apply potentials to said voltage divider so that the potential of a tap of said voltage divider represents the averaged value of said signals stored in said first and second sample and hold circuits.

32. The method of claim 31 wherein said step for applying comprises the step of:

applying at least a portion of said potential on said tap to said input of said operational amplifier to cancel any DC component of an AC signal applied to said input of said operational amplifier.

33. The method of claim 29 wherein said operational amplifier is an integrating operational amplifier.

34. The method of claim 33 wherein said first and second storage circuits comprise a first and a second sample and hold circuits;

said method further comprising the steps of:

operating said first sample and hold circuit at the zero crossing of said AC signal to store the peak amplitude of positive signals appearing on said output in response to transitions of a first polarity of said input signal, and operating said second sample and hold circuit at the zero crossing of said AC signal to store the peak amplitude of negative signals appearing on said output in response to transitions of a second polarity of said input signal.

35. The method of claim 34 wherein said step of generating a feedback signal comprises the steps of:

operating said first and second sample and hold circuits to apply potentials to a voltage divider connected between an output of said first sample and hold circuit and an output of said second sample and hold circuit so that the potential of a tap on said voltage divider represents the averaged value of said signals stored in said first and second sample and hold circuits.

36. The method of claim 35 wherein said step of applying comprises the step of:

applying at least a portion of said potential on said tap to said input of said integrating operational amplifier to cancel any DC component of an AC signal applied to said input of said integrating operational amplifier.

37. A method of operating an operational amplifier having an input and an output and circuitry for preventing a DC level shifting and saturation of said operational amplifier in response to the reception by said input of an AC signal having a DC offset, said method comprising the steps of:

operating a first sample and hold circuit under control of circuitry responsive to said reception of said AC signal and independent of said operational amplifier to store the peak amplitude of positive signals appearing on said output in response to transitions of a first polarity of an AC signal on said input, operating a second sample and hold circuit under control of circuitry responsive to said reception of said AC signal and independent of said operational amplifier to store the peak amplitude of negative signals appearing on said output in response to transitions of a second polarity of said AC signal on said input, operating said first and second sample and hold circuits for applying a potential across a voltage divider connected between an output of said first sample and hold circuit and an output of said second sample and hold circuit so that the potential of a tap on said voltage divider represents the averaged value of said signals stored in said first and second sample and hold circuits, and applying at least a portion of said potential on said tap to said input of said integrating operational amplifier that receives said AC signal to cancel any DC component of said AC signal applied to said input of said operational amplifier.

38. The method of claim 37 wherein said step of operating said first sample and hold circuit and said second sample and hold circuit comprises the steps of:

generating a differentiated AC signal in response to the receipt of an AC signal on said input, generating a square wave signal having the same frequency as said differentiated AC signal, operating said first sample and hold means to store the peak amplitude of a signal of one polarity appearing on said output of said integrating operational amplifier in response to the generation of each leading edge of said square wave signal, and operating said second sample and hold circuit to store the peak amplitude of a signal of another polarity appearing on said output of said integrating operational amplifier in response to the generation of each trailing edge of said square wave signal.

39. The method of claim 37 wherein said operational amplifier is an integrating operational amplifier.

40. The method of claim 37 wherein said step of operating said first sample and hold circuit and said second sample and hold circuit comprises the steps of:

generating a square wave signal having the same frequency as said AC signal, operating said first sample and hold means to store the peak amplitude of a signal of one polarity appearing on said output of said integrating operational amplifier in response to the generation of each leading edge of said square wave signal, and operating said second sample and hold circuit to store the peak amplitude of a signal of another polarity appearing on said output of said integrating operational amplifier in response to the generation of each trailing edge of said square wave signal.

* * * * *